US012707898B2

(12) United States Patent
Ishitani

(10) Patent No.: US 12,707,898 B2
(45) Date of Patent: Aug. 11, 2026

(54) MAGNETIZATION ROTATION ELEMENT, MAGNETORESISTIVE EFFECT ELEMENT, AND MAGNETIC MEMORY

(71) Applicant: TDK CORPORATION, Tokyo (JP)

(72) Inventor: Yugo Ishitani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 120 days.

(21) Appl. No.: 18/856,951

(22) PCT Filed: Jun. 30, 2022

(86) PCT No.: PCT/JP2022/026189
§ 371 (c)(1),
(2) Date: Oct. 15, 2024

(87) PCT Pub. No.: WO2024/004125
PCT Pub. Date: Jan. 4, 2024

(65) Prior Publication Data

US 2025/0255191 A1 Aug. 7, 2025

(51) Int. Cl.
*G11C 16/04* (2006.01)
*G11C 11/16* (2006.01)
(Continued)

(52) U.S. Cl.
CPC ........... *H10N 50/10* (2023.02); *G11C 11/161* (2013.01); *H10N 50/80* (2023.02); *G11C 11/1673* (2013.01); *G11C 11/1675* (2013.01)

(58) Field of Classification Search
CPC . G11C 11/16; G11C 11/1673; G11C 11/1675; H10N 50/10; H10N 50/80
See application file for complete search history.

(56) References Cited

U.S. PATENT DOCUMENTS 8,350,347 B2 1/2013 Gaudin et al.
2015/0194430 A1* 7/2015 Karda ................. H10B 12/056 438/587

(Continued)

FOREIGN PATENT DOCUMENTS

JP 2017-216286 A 12/2017
JP 2021-176162 A 11/2021
WO 2016/021468 A1 2/2016

OTHER PUBLICATIONS

Kato et al., "Observation of the Spin Hall Effect in Semiconductors," 2004, Science, vol. 306, pp. 1910-1913.

(Continued)

*Primary Examiner* — Pho M Luu
(74) *Attorney, Agent, or Firm* — Oliff PLC

(57) ABSTRACT

A magnetization rotation element includes a spin-orbit torque wiring, a first ferromagnetic layer, a first pillar, a second pillar, and a first conductive layer. The first ferromagnetic layer faces at least a part of the spin-orbit torque wiring. The first conductive layer is in contact with the spin-orbit torque wiring at a position not overlapping the first ferromagnetic layer when viewed from a laminating direction. The first pillar penetrates the spin-orbit torque wiring and is in contact with the spin-orbit torque wiring and the first conductive layer. The second pillar is in contact with the spin-orbit torque wiring at a position sandwiching the first ferromagnetic layer together with the first pillar when viewed from the laminating direction.

12 Claims, 11 Drawing Sheets

(51) Int. Cl.
*H10N 50/10* (2023.01)
*H10N 50/80* (2023.01)

(56) References Cited

U.S. PATENT DOCUMENTS

| | | | |
|---|---|---|---|
| 2015/0348606 A1 | 12/2015 | Buhrman et al. | |
| 2017/0222135 A1 | 8/2017 | Fukami et al. | |
| 2020/0006626 A1 | 1/2020 | Smith et al. | |
| 2020/0075670 A1 | 3/2020 | Lin et al. | |
| 2020/0202914 A1* | 6/2020 | Sakhare | G11C 11/1673 |
| 2023/0189663 A1* | 6/2023 | Sasaki | G11C 11/161 257/421 |

OTHER PUBLICATIONS

Miron et al., "Perpendicular switching of a single ferromagnetic layer induced by in-plane current injection," 2011, Nature, vol. 476, pp. 189-194.
Liu et al., "Spin torque switching with the giant spin Hall effect of tantalum," 2012, Science, vol. 336, pp. 1-12.
Liu et al., "Current-Induced Switching of Perpendicularly Magnetized Magnetic Layers Using Spin Torque from the Spin Hall Effect," 2012, Physical Review Letters, vol. 109, 096602, pp. 1-5.
Lee et al., "Threshold current for switching of a perpendicular magnetic layer induced by spin Hall effect," 2013, Applied Physics Letters, vol. 102, 112410, pp. 1-5.
Lee et al., "Thermally activated switching of perpendicular magnet by spin-orbit spin torque," 2014, Applied Physics Letters, vol. 104, 072413, pp. 1-5.
Fukami et al., "Magnetization switching by spin-orbit torque in an antiferromagnet-ferromagnet bilayer system," 2016, Nature Materials, vol. 15, pp. 535-542.
Fukami et al., "A spin-orbit torque switching scheme with collinear magnetic easy axis and current configuration," 2016, Nature Nanotechnology, vol. 11, pp. 1-6.
Takahashi et al., "Spin injection and detection in magnetic nanostructures," 2003, Physical Review B, vol. 67, 052409, pp. 1-4.
Sep. 13, 2022 International Search Report issued in International Patent Application No. PCT/JP2022/026189.

* cited by examiner 100
94
20B
93
20A
92
40
91
$t_{40}$
20
4
1
3
2
5
6
10
30
30B
31
30A
50
L1, $t_{10}$
$t_{50}$
x
z
y 101
94
20B
93
20A
92
40
91
20
4
1
3
2
5
6
10
30
30B
31
30A
50
51
L1, t10
t50
x
y
z 103
94
20B
93
20A
92
40
91
20
4
1
3
2
5
6
10
50
30
30B
31
L1, $t_{10}$
$t_{50}$
x
y
z

MAGNETIZATION ROTATION ELEMENT, MAGNETORESISTIVE EFFECT ELEMENT, AND MAGNETIC MEMORY

TECHNICAL FIELD

The present invention relates to a magnetization rotation element, a magnetoresistive effect element, and a magnetic memory.

BACKGROUND ART

Giant magnetoresistive (GMR) elements formed of a multilayer film of ferromagnetic layers and non-magnetic layers, and tunnel magnetoresistive (TMR) elements using an insulating layer (tunnel barrier layer, barrier layer) as a non-magnetic layer are known as magnetoresistive effect elements. The magnetoresistive effect elements can be applied to magnetic sensors, high-frequency components, magnetic heads, and non-volatile random access memories (MRAMs).

The MRAM is a memory element in which magnetoresistive effect elements are integrated. The MRAM reads and writes data by using the property that the resistance of the magnetoresistive effect element changes when the magnetization directions of two ferromagnetic layers sandwiching a non-magnetic layer in the magnetoresistive effect element change. The magnetization direction of the ferromagnetic layer can be controlled, for example, by using a magnetic field generated by a current. Further, for example, the magnetization direction of the ferromagnetic layer is controlled by using spin transfer torque (STT) that is generated by passing a current in the laminating direction of the magnetoresistive effect element.

When using STT to rewrite the magnetization direction of the ferromagnetic layer, a current is passed in the laminating direction of the magnetoresistive effect element. The write current causes the characteristics of the magnetoresistive effect element to deteriorate.

In recent years, attention has been focused on a method that does not require a current to flow in the laminating direction of the magnetoresistive effect element during writing (for example, Patent Document 1). One of these methods is a writing method that uses spin-orbit torque (SOT). SOT is induced by spin currents generated by spin-orbit interaction or the Rashba effect at the interface of dissimilar materials. The current for inducing the SOT in the magnetoresistive effect element flows in a direction intersecting the laminating direction of the magnetoresistive effect element. In other words, there is no need to pass a current in the laminating direction of the magnetoresistive effect element, and this is expected to extend the life of the magnetoresistive effect element.

CITATION LIST

Patent Document

Patent Document 1

Japanese Unexamined Patent Application, First Publication No. 2017-216286

SUMMARY OF INVENTION

Technical Problem

In the magnetoresistive effect element using spin orbit torque (SOT), the magnetization of the ferromagnetic layer is reversed when the current density of the write current flowing through the spin-orbit torque wiring reaches or exceeds a predetermined value. The current density of the write current at which the magnetization of the ferromagnetic layer is reversed is called the reversal current density. In order to obtain sufficient reversal current density, the thickness of the spin-orbit torque wiring is often made thin. The write current to the spin-orbit torque wiring is supplied through the via wiring. In the case of a thin spin-orbit torque wiring, it is difficult to ensure a sufficient electrical contact point between the via wiring and the spin-orbit torque wiring.

The present invention has been made in view of the above-described circumstances and an object of the present invention is to provide a magnetization rotation element, a magnetoresistive effect element, and a magnetic memory capable of ensuring a sufficient electrical contact point between a via wiring and a spin-orbit torque wiring.

Solution to Problem

The present invention provides the following means in order to solve the above-described problems.

(1) A magnetization rotation element according to a first aspect includes a spin-orbit torque wiring, a first ferromagnetic layer, a first pillar, a second pillar, and a first conductive layer. The first ferromagnetic layer faces at least a part of the spin-orbit torque wiring. The first conductive layer is in contact with the spin-orbit torque wiring at a position not overlapping the first ferromagnetic layer when viewed from a laminating direction. The first pillar penetrates the spin-orbit torque wiring. The first pillar is in contact with the spin-orbit torque wiring and the first conductive layer. The second pillar is in contact with the spin-orbit torque wiring at a position sandwiching the first ferromagnetic layer together with the first pillar when viewed from the laminating direction.

(2) In the magnetization rotation element according to the above aspect, a part of a side wall of the first pillar may be in contact with the first conductive layer over the entire circumstance.

(3) In the magnetization rotation element according to the above aspect, a first end of the first pillar in the laminating direction may be in contact with the first conductive layer.

(4) The magnetization rotation element according to the above aspect may further include a covering layer. The covering layer may cover a surface other than a surface in contact with the spin-orbit torque wiring of the first conductive layer.

(5) In the magnetization rotation element according to the above aspect, the covering layer may have an etching rate lower than that of the first conductive layer when ion milling is performed under the same conditions.

(6) In the magnetization rotation element according to the above aspect, the covering layer may have an etching rate lower than that of the first conductive layer in reactive ion etching under the same conditions.

(7) In the magnetization rotation element according to the above aspect, the first conductive layer may have a film thickness of 5% or more of a height of a perpendicular line extending from a second end of the first pillar to the spin-orbit torque wiring. The second end may be an end of the first pillar farther from the first conductive layer in the laminating direction.

(8) In the magnetization rotation element according to the above aspect, the first conductive layer may have a film thickness of 300% or less of a height of a perpendicular line extending from a second end of the first pillar to the spin-orbit torque wiring (9) In the magnetization rotation element according to the above aspect, the first conductive layer and the second pillar may be in contact with the same surface of the spin-orbit torque wiring. The first conductive layer and the second pillar may have the same main component among their constituent elements.

(10) The magnetization rotation element according to the above aspect may further include a second conductive layer. The second conductive layer may be in contact with the spin-orbit torque wiring. The second pillar may penetrate the spin-orbit torque wiring and be in contact with the spin-orbit torque wiring and the second conductive layer.

(11) A magnetoresistive effect element according to a second aspect may include at least the magnetization rotation element, the non-magnetic layer, and the second ferromagnetic layer according to the above aspect. The first ferromagnetic layer and the second ferromagnetic layer of the magnetization rotation element may sandwich the non-magnetic layer.

(12) A magnetic memory according to a third aspect includes the magnetoresistive effect element according to the above aspect.

Advantageous Effects of Invention

The magnetization rotation element, the magnetoresistive effect element, and the magnetic memory according to the present disclosure can ensure a sufficient electrical contact point between the via wiring and the spin-orbit torque wiring.

DESCRIPTION OF EMBODIMENTS

Hereinafter, this embodiment will be described in detail with reference to the drawings. The drawings used in the following description may show characteristic parts in an enlarged scale for the sake of convenience in order to make the characteristics easier to understand, and the dimensional ratios of each component may differ from the actual ones. The materials, dimensions, and the like exemplified in the following description are merely examples, and the present invention is not limited to them. They can be modified as appropriate within the scope of the effects of the present invention.

First, directions will be defined. One direction on one surface of a substrate Sub (see FIG. 2) described later is defined as an x direction, and a direction perpendicular to the x direction is defined as a y direction. The x direction is, for example, the longitudinal direction of a spin-orbit torque wiring 20. The z direction is perpendicular to the x and y directions.
The z direction is an example of a laminating direction in which the layers are laminated. Hereinafter, the +z direction may be expressed as "up" and the −z direction as "down." Up and down do not necessarily coincide with the direction in which gravity is applied.

In this specification, "extending in the x direction" means, for example, that the dimension in the x direction is larger than the smallest dimension among the dimensions in the x direction, the y direction, and the z direction. The same applies to the other directions. In this specification, "connection" is not limited to physical connection. For example, "connection" does not necessarily mean that two layers are physically in contact with each other, but also includes a case in which two layers are connected with another layer interposed therebetween. In this specification, "connection" includes electrical connection. In this specification, "facing" means that two layers face each other, and the two layers may be in contact with each other or may face each other with another layer interposed therebetween.

First Embodiment

Figure 1:
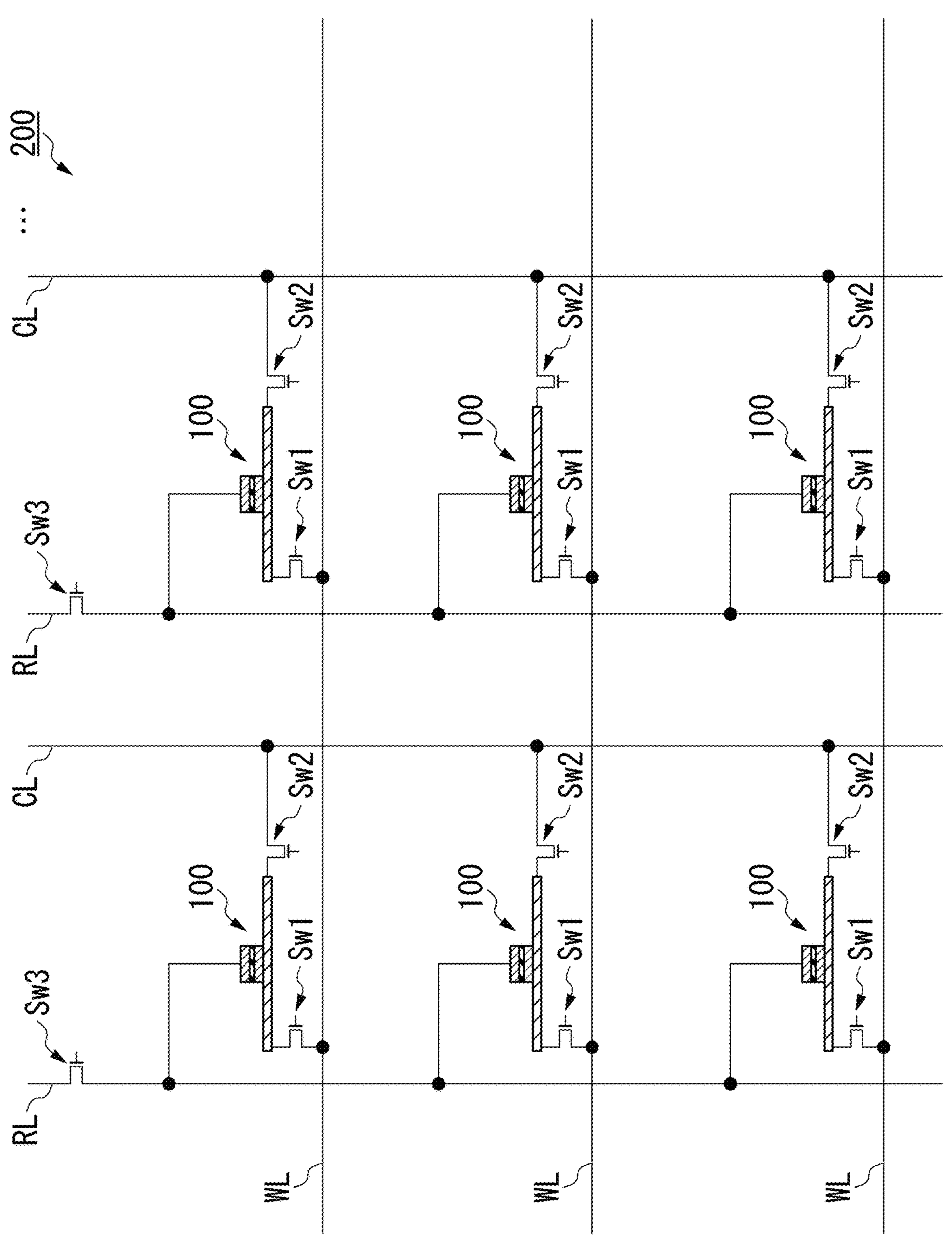
FIG. 1 is a circuit diagram of a magnetic memory according to a first embodiment.

FIG. 1 is a configuration diagram of a magnetic memory 200 according to a first embodiment. The magnetic memory 200 includes a plurality of magnetoresistive effect elements 100, a plurality of write lines WL, a plurality of common lines CL, a plurality of read lines RL, a plurality of first switching elements Sw1, a plurality of second switching elements Sw2, and a plurality of third switching elements Sw3. In the magnetic memory 200, for example, the magnetoresistive effect elements 100 are arranged in a matrix.

Each write line WL electrically connects a power source to one or more magnetoresistive effect elements 100. Each common line CL is a wiring used both when writing and reading data. Each common line CL electrically connects a reference potential to one or more magnetoresistive effect elements 100. The reference potential is, for example, ground. The common line CL may be provided in each of the plurality of magnetoresistive effect elements 100 or may be provided across the plurality of magnetoresistive effect elements 100. Each read line RL electrically connects the power source to one or more magnetoresistive effect elements 100. The power source is connected to the magnetic memory 200 in use.

Each magnetoresistive effect element 100 is electrically connected to each of the first switching element Sw1, the second switching element Sw2, and the third switching element Sw3. The first switching element Sw1 is connected between the magnetoresistive effect element 100 and the write line WL. The second switching element Sw2 is connected between the magnetoresistive effect element 100 and the common line CL. The third switching element Sw3 is connected to the read line RL that spans the plurality of magnetoresistive effect elements 100.

When a predetermined first switching element Sw1 and a predetermined second switching element Sw2 are turned on, a write current flows between the write line WL and the common line CL connected to a predetermined magnetoresistive effect element 100. When a write current flows, data is written to a predetermined magnetoresistive effect element 100. When a predetermined second switching element Sw2 and a predetermined third switching element Sw3 are turned on, a read current flows between the common line CL and the read line RL connected to a predetermined magnetoresistive effect element 100. When a read current flows, data is read from a predetermined magnetoresistive effect element 100.

The first switching element Sw1, the second switching element Sw2, and the third switching element Sw3 are elements that control the flow of current. The first switching element Sw1, the second switching element Sw2, and the third switching element Sw3 are, for example, an element that uses a transistor, a phase change of a crystal layer such as an Ovonic Threshold Switch (OTS), an element that uses a change in band structure such as a Metal-Insulator Transition (MIT) switch, an element that uses a breakdown voltage such as a Zener diode or an avalanche diode, or an element whose conductivity changes with a change in atomic position.

In the magnetic memory 200 shown in FIG. 1, the magnetoresistive effect elements 100 connected to the same read line RL share the third switching element Sw3. The third switching element Sw3 may be provided in each magnetoresistive effect element 100. Further, the third switching element Sw3 may be provided in each magnetoresistive effect element 100, and the first switching element Sw1 or the second switching element Sw2 may be shared by the magnetoresistive effect elements 100 connected to the same wiring.

Figure 2:
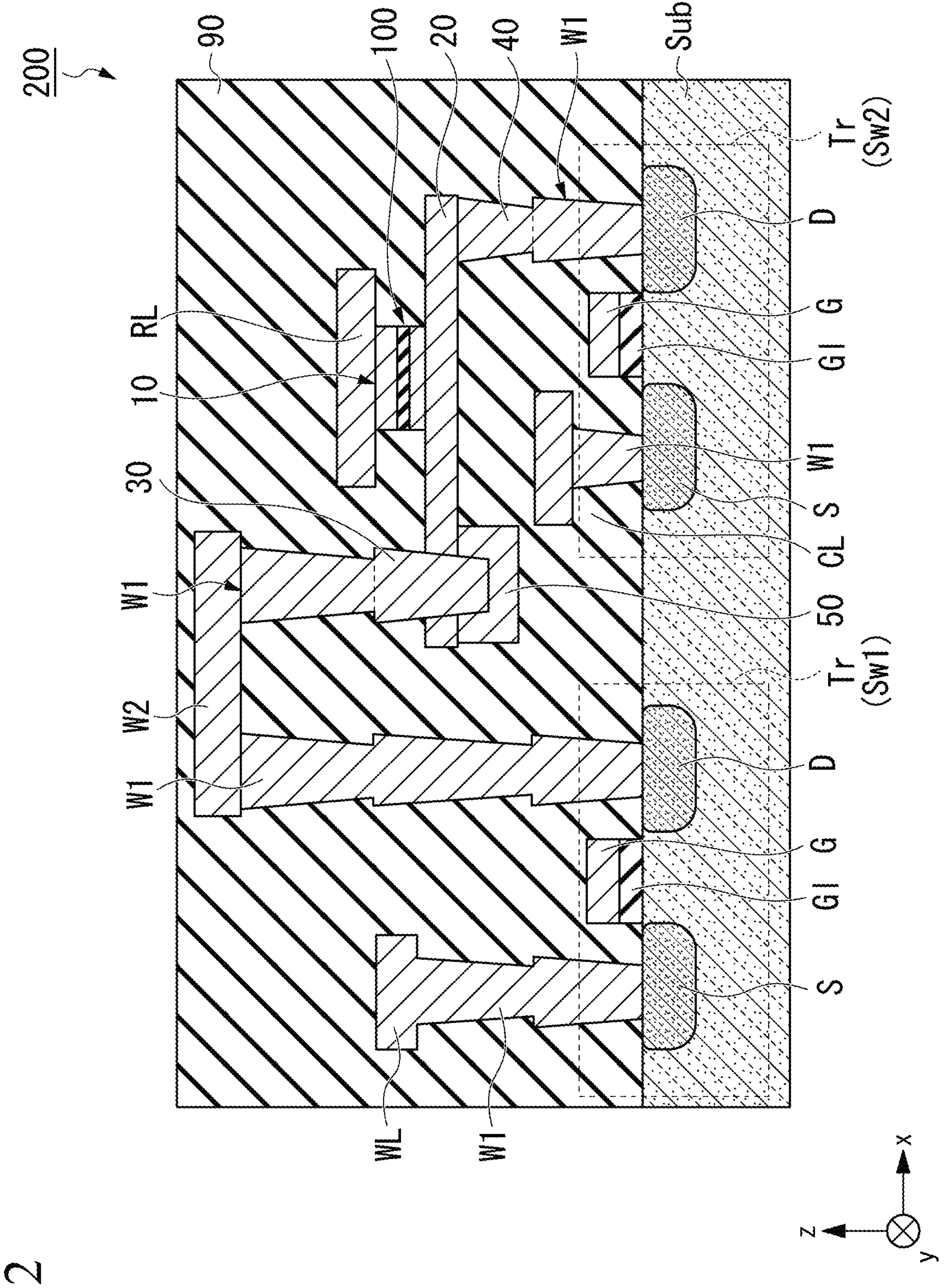
FIG. 2 is a cross-sectional view of a characteristic part of the magnetic memory according to the first embodiment.

FIG. 2 is a cross-sectional view of a characteristic part of magnetic memory 200 according to the first embodiment. FIG. 2 is a cross-section of the magnetoresistive effect element 100 cut along an xz plane passing through the center of the width in the y direction of the spin-orbit torque wiring 20, which will be described later.

The first switching element Sw1 and the second switching element Sw2 shown in FIG. 2 are transistors Tr. The third switching element Sw3 is electrically connected to the read line RL and is located at a different position in the y direction in FIG. 2, for example. The transistor Tr is, for example, a field effect transistor, and has a gate electrode G, a gate insulating film GI, and a source S and a drain D formed on the substrate Sub. The source S and the drain D are determined by the direction of current flow and are the same area. The positional relationship between the source S and the drain D may be reversed. The substrate Sub is, for example, a semiconductor substrate.

The transistor Tr and the magnetoresistive effect element 100 are electrically connected through a via wiring W1 and an in-plane wiring W2. Further, the transistor Tr and the write line WL or the common line CL are connected by the via wiring W1. The via wiring W1 extends in, for example, the z direction. The via wiring W1 may be formed by laminating a plurality of pillars. The in-plane wiring W2 extends in any direction within the xy plane. The via wiring W1 and the in-plane wiring W2 include a material having electrical conductivity.

The magnetoresistive effect element 100 and the transistor Tr are covered with an insulating layer 90. The insulating layer 90 is an insulating layer that provides insulation between wirings in a multi-layer wiring structure and between elements. The insulating layer 90 is formed of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), magnesium oxide (MgO), aluminum nitride (AlN), or the like.

Figure 3:
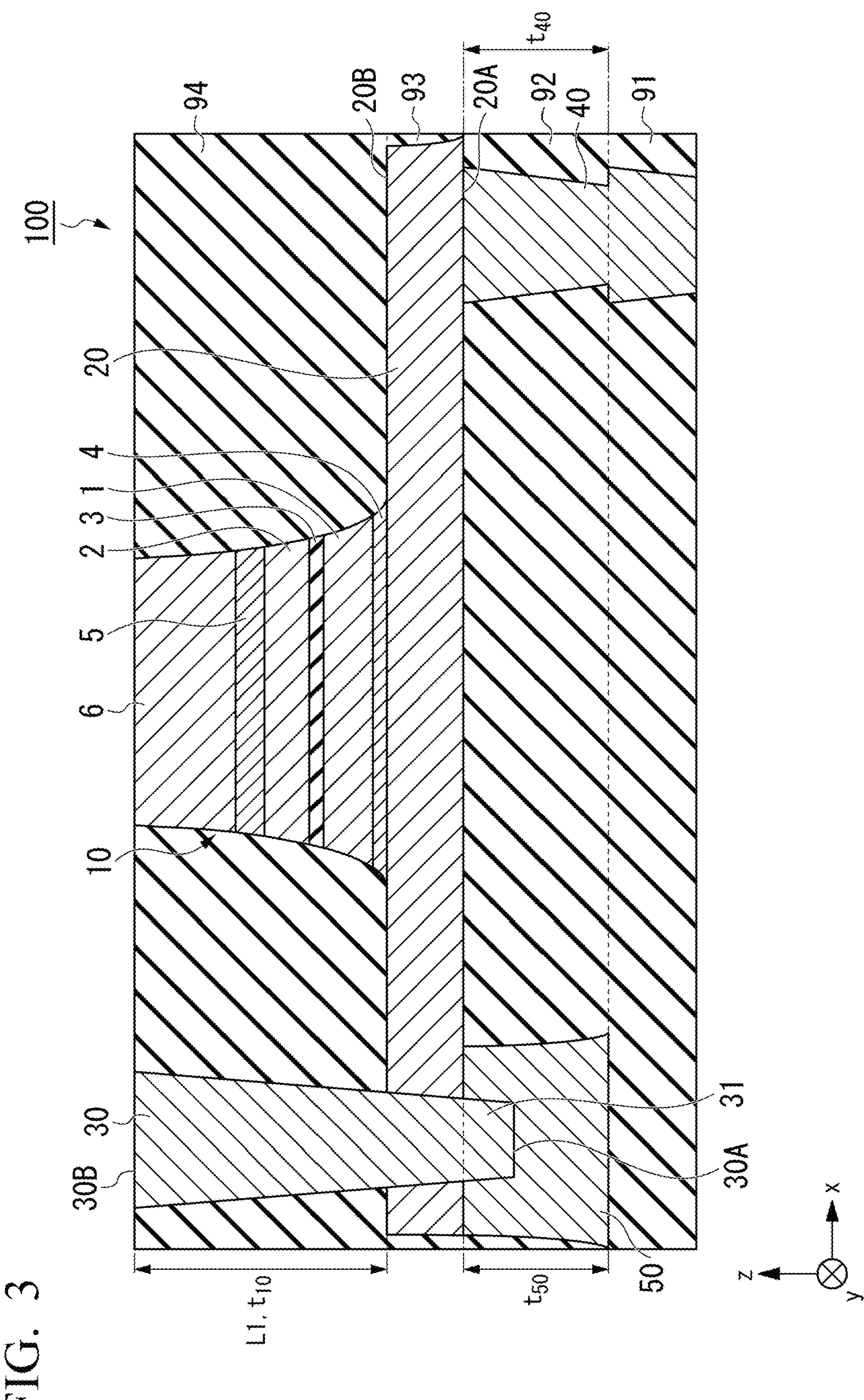
FIG. 3 is a cross-sectional view of a magnetoresistive effect element according to the first embodiment.
Figure 4:
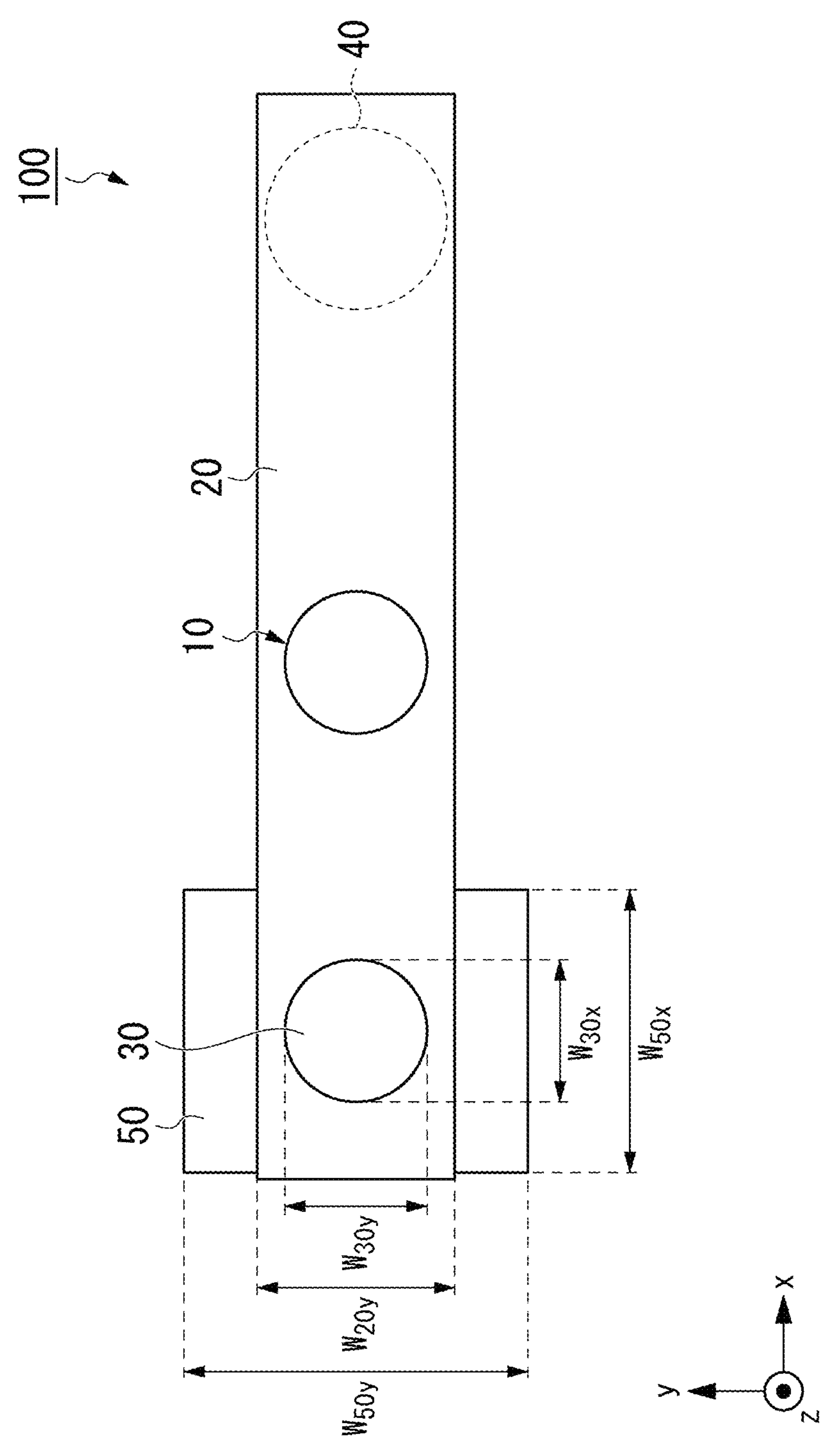
FIG. 4 is a plan view of the magnetoresistive effect element according to the first embodiment.

FIG. 3 is a cross-sectional view of the magnetoresistive effect element 100. FIG. 3 is a cross-section of the magnetoresistive effect element 100 cut along the xz plane passing through the center of the width of the spin-orbit torque wiring 20 in the y direction. FIG. 4 is a plan view when the magnetoresistive effect element 100 is viewed from the z direction.

The magnetoresistive effect element 100 includes, for example, a laminate 10, the spin-orbit torque wiring 20, a first pillar 30, a second pillar 40, and a first conductive layer 50. The magnetoresistive effect element 100 is covered with insulating layers 91, 92, 93, and 94. The insulating layers 91, 92, 93, and 94 are laminated as a part of the insulating layer 90. Each of the insulating layers 91, 92, 93, and 94 is an interlayer insulating film laminated in a hierarchical manner.

The magnetoresistive effect element 100 is a magnetic element that uses spin-orbit torque (SOT), and may be called a spin-orbit torque type magnetoresistive effect element, a spin injection type magnetoresistive effect element, or a spin current magnetoresistive effect element.

The magnetoresistive effect element 100 is an element that records and stores data. The magnetoresistive effect element 100 records data by the resistance value of the laminate 10 in the z direction. The resistance value of the laminate 10 in the z direction changes when a write current is applied along the spin-orbit torque wiring 20 and spins are injected from the spin-orbit torque wiring 20 into the laminate 10. The resistance value of the laminate 10 in the z direction can be read by applying a read current to the laminate 10 in the z direction.

The laminate 10 is connected to the spin-orbit torque wiring 20. The laminate 10 is laminated, for example, on the spin-orbit torque wiring 20.

The laminate 10 is a pillar. The shape of the laminate 10 in a plan view in the z direction is, for example, a circle, an ellipse, or a rectangle. The side surface of the laminate 10 is, for example, inclined with respect to the z direction.

The laminate 10 includes, for example, a first ferromagnetic layer 1, a second ferromagnetic layer 2, a non-magnetic layer 3, an underlayer 4, a cap layer 5, and a mask layer 6. The resistance value of the laminate 10 changes according to the difference in the relative angle between the magnetizations of the first ferromagnetic layer 1 and the second ferromagnetic layer 2 that sandwich the non-magnetic layer 3.

The first ferromagnetic layer 1 faces, for example, the spin-orbit torque wiring 20. The first ferromagnetic layer 1 may be in direct contact with the spin-orbit torque wiring 20 or may be in indirect contact with the spin-orbit torque wiring 20 with the underlayer 4 interposed therebetween. The first ferromagnetic layer 1 is laminated, for example, on the spin-orbit torque wiring 20.

Spins are injected into the ferromagnetic layer 1 from the spin-orbit torque wiring 20. The magnetization of the first ferromagnetic layer 1 is subjected to a spin-orbit torque (SOT) by the injected spins, and the orientation direction of the magnetization changes. The first ferromagnetic layer 1 is called a magnetization free layer.

The first ferromagnetic layer 1 includes a ferromagnetic material. The ferromagnetic material is, for example, a metal selected from the group consisting of Cr, Mn, Co, Fe, and Ni, an alloy containing one or more of these metals, or an alloy containing these metals and at least one of the elements B, C, and N. Examples of the ferromagnetic material include Co—Fe, Co—Fe—B, Ni—Fe, Co—Ho alloy, Sm—Fe alloy, Fe—Pt alloy, Co—Pt alloy, and CoCrPt alloy.

The first ferromagnetic layer 1 may include a Heusler alloy. Heusler alloys contain intermetallic compounds with the chemical composition XYZ or $X_2YZ$. X is a transition metal element or a noble metal element of the Co group, Fe group, Ni group, or Cu group on the periodic table, Y is a transition metal element of the Mn group, V group, Cr group, or Ti group, or an element type of X, and Z is a typical element of groups III to V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. Heusler alloys have high spin polarizability.

The second ferromagnetic layer 2 faces the first ferromagnetic layer 1 with the non-magnetic layer 3 interposed therebetween. The second ferromagnetic layer 2 includes a ferromagnetic material. The magnetization of the second ferromagnetic layer 2 is less likely to change its orientation than the magnetization of the first ferromagnetic layer 1 when a predetermined external force is applied. The second ferromagnetic layer 2 is called a magnetization fixed layer and a magnetization reference layer. The laminate 10 shown in FIG. 3 has the magnetization fixed layer on the side away from the substrate Sub, and is called a top pin structure.

The second ferromagnetic layer 2 is formed of the same material as the first ferromagnetic layer 1.

The second ferromagnetic layer 2 may have a synthetic antiferromagnetic structure (SAF structure). The synthetic antiferromagnetic structure consists of two magnetic layers sandwiching a non-magnetic layer. The second ferromagnetic layer 2 may include two magnetic layers and a spacer layer sandwiched between them. The coercive force of the second ferromagnetic layer 2 increases due to the antiferromagnetic coupling between the two ferromagnetic layers. The ferromagnetic layer is formed of, for example, IrMn, PtMn, or the like. The spacer layer includes, for example, at least one selected from the group consisting of Ru, Ir, and Rh.

The non-magnetic layer 3 is sandwiched between the first ferromagnetic layer 1 and the second ferromagnetic layer 2. The non-magnetic layer 3 includes a non-magnetic material. When the non-magnetic layer 3 is formed of an insulator (when it is a tunnel barrier layer), examples of the material that can be used include $Al_2O_3$, $SiO_2$, MgO, and $MgAl_2O_4$. In addition to these, materials in which part of Al, Si, and Mg is replaced with Zn, Be, and the like can also be used. Among these, MgO and $MgAl_2O_4$ are materials that can realize coherent tunneling, and therefore can inject spins efficiently. When the non-magnetic layer 3 is formed of metal, the material may be Cu, Au, Ag, or the like. Furthermore, when the non-magnetic layer 3 is formed of a semiconductor, its material may be Si, Ge, $CuInSe_2$, $CuGaSe_2$, Cu(In, Ga)$Se_2$, or the like.

The underlayer 4 is, for example, between the first ferromagnetic layer 1 and the spin-orbit torque wiring 20. The underlayer 4 may not be provided.

The underlayer 4 includes, for example, a buffer layer and a seed layer. The buffer layer is a layer that relieves lattice mismatch between different crystals. The seed layer enhances the crystallinity of a layer laminated on the seed layer. The seed layer is formed on, for example, the buffer layer.

The buffer layer is formed of, for example, Ta (simple material), TaN (tantalum nitride), CuN (copper nitride), TiN (titanium nitride), NiAl (nickel aluminum), or the like. The seed layer is formed of, for example, Pt, Ru, Zr, NiCr alloy, or NiFeCr.

The cap layer 5 is on the second ferromagnetic layer 2. The cap layer 5 enhances, for example, the perpendicular magnetic anisotropy of the second ferromagnetic layer 2. The cap layer 5 is formed of, for example, magnesium oxide, W, Ta, Mo, and the like. The thickness of the cap layer 5 is, for example, 0.5 nm or more and 5.0 nm or less.

The mask layer 6 is on the cap layer 5. The mask layer 6 is a part of a hard mask used when processing the laminate 10 during manufacture. The mask layer 6 also functions as an electrode. The mask layer 6 includes, for example, Al, Cu, Ta, Ti, Zr, NiCr, a nitride (for example, TiN, TaN, SiN), or an oxide (for example, $SiO_2$).

The laminate 10 may include layers other than the first ferromagnetic layer 1, the second ferromagnetic layer 2, the non-magnetic layer 3, the underlayer 4, the cap layer 5, and the mask layer 6.

The spin-orbit torque wiring 20 extends in the x direction, for example, such that the length in the x direction is longer than the length in the y direction when viewed from the z direction. The write current flows in the x direction along the spin-orbit torque wiring 20 between the first pillar 30 and the second pilar 40.

The spin-orbit torque wiring 20 generates a spin current by the spin Hall effect when a current flows, and injects spins into the first ferromagnetic layer 1. The spin-orbit torque wiring 20 applies, for example, a spin-orbit torque (SOT) sufficient to reverse the magnetization of the first ferromagnetic layer 1 to the magnetization of the first ferromagnetic layer 1.

The spin Hall effect is a phenomenon in which a spin current is induced in a direction perpendicular to the current flow direction due to spin-orbit interaction when a current is passed through a material. The spin Hall effect has a common point with the normal Hall effect in that the direction of moving charges (electrons) can be bent. In the conventional Hall effect, the moving direction of charged particles moving in a magnetic field is bent by the Lorentz force. In contrast, the spin Hall effect allows the spin movement direction to be bent simply by the movement of electrons (the flow of current) even in the absence of a magnetic field.

For example, when a current flows through the spin-orbit torque wiring 20, the first spins polarized in one direction and the second spins polarized in the opposite direction to the first spins are bent by the spin Hall effect in a direction perpendicular to the current flow direction. For example, the first spins polarized in the −y direction are bent from the x direction, which is the travel direction, to the +z direction, and the second spins polarized in the +y direction are bent from the x direction, which is the travel direction, to the −z direction.

In a non-magnetic material (a material that is not ferromagnetic), the number of electrons with the first spin generated by the spin Hall effect is equal to the number of electrons with the second spin. That is, the number of electrons with the first spin in the +z direction is equal to the number of electrons with the second spin in the −z direction. The first and second spins flow in a direction that eliminates the uneven distribution of spins. In the movement of the first spin and the second spin in the z direction, the flows of charges cancel each other out, so the current amount is zero. A spin current that does not involve a current is particularly called a pure spin current.

If the flow of electrons with the first spin is expressed as $J_\uparrow$, the flow of electrons with the second spin is expressed as $J_\downarrow$, and the spin current is expressed as $J_S$, $J_S=J_\uparrow-J_\downarrow$. The spin current $J_S$ is generated in the z direction. The first spin is injected from the spin-orbit torque wiring 20 into the first ferromagnetic layer 1.

The spin-orbit torque wiring 20 includes any one of a metal, an alloy, an intermetallic compound, a metal boride, a metal carbide, a metal silicide, a metal phosphide, and a metal nitride that has the function of generating a spin current by the spin Hall effect when a write current flows. The spin-orbit torque wiring 20 includes, for example, any material selected from the group consisting of heavy metals having an atomic number of 39 or more, metal oxides, metal nitrides, metal oxynitrides, and topological insulators.

The spin-orbit torque wiring 20 includes, for example, a non-magnetic heavy metal as a main component. Heavy metals refer to metals with a specific gravity equal to or larger than that of yttrium (Y). Non-magnetic heavy metals are, for example, non-magnetic metals with a large atomic number of 39 or more that have d electrons or f electrons in their outermost shell. The spin-orbit torque wiring 20 is formed of, for example, Hf, Ta, and W. Non-magnetic heavy metals have stronger spin-orbit interaction than other metals. The spin Hall effect is generated by spin-orbit interaction, and spins tend to be unevenly distributed in the spin-orbit torque wiring 20, thereby easily generating the spin current $J_S$.

The spin-orbit torque wiring 20 may further include a magnetic metal. The magnetic metal is a ferromagnetic metal or an antiferromagnetic metal. A small amount of magnetic metal contained in a non-magnetic material acts as a scattering factor for spins. The small amount is, for example, 3% or less of the total molar ratio of the elements constituting the spin-orbit torque wiring 20. When the spins are scattered by the magnetic metal, the spin orbit interaction is enhanced, and the efficiency of generating a spin current relative to a current increases.

The spin-orbit torque wiring 20 may include a topological insulator. The topological insulator is a material in which the interior is an insulator or a highly resistive material, but a spin-polarized metallic state exists on its surface. Topological insulators have internal magnetic fields due to spin-orbit interaction. Topological insulators exhibit new topological phases due to the effect of spin-orbit interaction even in the absence of an external magnetic field. Topological insulators can generate pure spin currents with high efficiency due to strong spin-orbit coupling and broken inversion symmetry at the edges.

Examples of topological insulators include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. Topological insulators are capable of generating spin currents with high efficiency.

The spin-orbit torque wiring 20 is not limited to a single layer, and may be a laminate of multiple layers. The spin-orbit torque wiring 20 may have, for example, multiple heavy metal layers and an insertion layer sandwiched between them.

The electrical resistivity of the spin-orbit torque wiring 20 is, for example, 1 mΩ·cm or more. Further, the electrical resistivity of the spin-orbit torque wiring 20 is, for example, 10 mΩ·cm or less. When the electrical resistivity of the spin-orbit torque wiring 20 is high, a high voltage can be applied to the spin-orbit torque wiring 20. When the potential of the spin-orbit torque wiring 20 becomes high, spins can be efficiently supplied from the spin-orbit torque wiring 20 to the first ferromagnetic layer 1. Furthermore, since the spin-orbit torque wiring 20 has a certain level of conductivity or more, a current path that flows along the spin-orbit torque wiring 20 can be ensured, and a spin current associated with the spin Hall effect can be efficiently generated.

The thickness of the spin-orbit torque wiring 20 is, for example, 4 nm or more. The thickness of the spin-orbit torque wiring 20 may be, for example, 20 nm or less.

The first pillar 30 is a part of the via wiring W1. The first pillar 30 is a pillar that is closest to the spin-orbit torque wiring 20 among the via wirings W1. The pillar is, for example, a circular pillar, an elliptical pillar, or a rectangular pillar. An area of the via wiring W1 where the perimeter is either continuously changing or constant is defined as one pillar. The pillar is formed by filling an opening formed in a single processing process during manufacture with a conductor.

The first pillar 30 penetrates the spin-orbit torque wiring 20. The first pillar 30 is in contact with the spin-orbit torque wiring 20 and the first conductive layer 50.

The first pillar 30 has, for example, a first area 31. The first area 31 is a portion that protrudes from a first surface 20A of the spin-orbit torque wiring 20 in the first pillar 30. The first surface 20A is a surface that is in contact with the first conductive layer 50 in the spin-orbit torque wiring 20.

The first area 31 is surrounded by the first conductive layer 50. In the first area 31, the side wall of the first pillar 30 is in contact with the first conductive layer 50 over the entire circumference. Further, a first end 30A of the first pillar 30 is in contact with the first conductive layer 50. The first end 30A is an end close to the first conductive layer 50 in the z direction.

The first pillar 30 includes a conductive material. The first pillar 30 is formed of, for example, aluminum, copper, silver, or the like.

The second pillar 40 is a part of the via wiring W1. The second pillar 40 is a pillar that is closest to the spin-orbit torque wiring 20 in the via wiring W1 different from the via wiring W1 including the first pillar 30.

The second pillar 40 is in contact with the spin-orbit torque wiring 20 at a position sandwiching the first ferromagnetic layer 1 together with the first pillar 30 when viewed from the z direction. The first pillar 30 and the second pillar 40 are respectively connected to different positions of the spin-orbit torque wiring 20 in the x direction. When viewed from the z direction, there is a laminate between the first pillar 30 and the second pillar 40 in the x direction.

For example, the second pillar 40 is in contact with the first surface 20A which is in contact with the first conductive layer 50. For example, the center point of the first pillar 30 in the z direction and the center point of the second pillar 40 in the z direction are in a positional relationship in the z direction such that they sandwich a reference plane on which the spin-orbit torque wiring 20 extends. The second pillar 40 may be in contact with a second surface 20B that faces the first surface 20A.

The second pillar 40 includes a conductive material. The second pillar 40 is formed of, for example, aluminum, copper, silver, or the like.

The film thickness $t_{40}$ of the second pillar 40 is equal to, for example, the film thickness $t_{50}$ of the first conductive layer 50.

The first conductive layer 50 is in contact with the spin-orbit torque wiring 20. For example, the first conductive layer 50 is in contact with the spin-orbit torque wiring 20 at a position not overlapping the first ferromagnetic layer

1 when viewed from the z direction. For example, the first conductive layer 50 overlaps the first pillar 30 when viewed from the z direction.

For example, the width $W_{50y}$ of the first conductive layer 50 in the y direction is wider than the width $W_{20y}$ of the spin-orbit torque wiring 20 in the y direction. For example, the width $W_{50y}$ of the first conductive layer 50 in the y direction is wider than the width $W_{30y}$ of the first pillar 30 in the y direction. For example, the width $W_{20y}$ of the spin-orbit torque wiring 20 in the y direction is wider than the width $W_{30y}$ of the first pillar 30 in the y direction. For example, the width $W_{30y}$ of the first pillar 30 in the y direction is the width of the first pillar 30 in the y direction in a surface that is in contact with the second surface 20B of the spin-orbit torque wiring 20.

The width $W_{50x}$ of the first conductive layer 50 in the x direction is wider than the width $W_{30x}$ of the first pillar 30 in the x direction. The width $W_{30x}$ of the first pillar 30 in the x direction is the width of the first pillar 30 in the x direction in a surface that is in contact with the second surface 20B of the spin-orbit torque wiring 20.

When the widths $W_{50x}$ and $W_{50y}$ of the first conductive layer 50 are sufficiently wide, sufficient electrical connection between the first pillar 30 and the first conductive layer 50 can be ensured even when the opening formation position is shifted at the time of manufacturing the first pillar 30.

For example, the film thickness $t_{50}$ of the first conductive layer 50 is 5% or more of the height L1 of the perpendicular line extending from a second end 30B of the first pillar 30 to the second surface 20B of the spin-orbit torque wiring 20. Further, for example, the film thickness t-o of the first conductive layer 50 is 300% or less of the height L1 of the perpendicular line extending from the second end 30B of the first pillar 30 to the second surface 20B of the spin-orbit torque wiring 20. The first pillar 30 is formed by filling an opening formed in an insulating layer 94 with a conductor. The height L1 of the perpendicular line extending from the second end 30B to the second surface 20B is equal to the depth of the opening. When the film thickness $t_{50}$ of the first conductive layer 50 is within the above range, it is possible to suppress the opening from penetrating the first conductive layer 50 when the opening is formed.

The second end 30B is an end opposite to the first end 30A in the first pillar 30. The second end 30B is an end farther from the first conductive layer 50 in the first pillar 30 in the z direction. The second surface 20B is a surface that faces the first surface 20A which is in contact with the first conductive layer 50.

For example, the film thickness $t_{50}$ of the first conductive layer 50 is 5% or more of the height $t_{10}$ of the laminate 10. For example, the film thickness $t_{50}$ of the first conductive layer 50 is 300% or less of the height $t_{10}$ of the laminate 10. The film thickness $t_{50}$ of the first conductive layer 50 may be substantially equal to the height L1 of the perpendicular line extending from the second end 30B to the second surface 20B.

The first conductive layer 50 includes a conductive material. The first conductive layer 50 is formed of, for example, aluminum, copper, silver, or the like.

The first conductive layer 50 may be formed of the same material as the spin-orbit torque wiring 20. When the first conductive layer 50 and the spin-orbit torque wiring 20 are formed of the same material, the portion protruding from the surface on which the first surface 20A of the spin-orbit torque wiring 20 extends at a position overlapping the laminate 10 in the z direction becomes the first conductive layer 50.

Further, when the first conductive layer 50 and the second pillar 40 are in contact with the same surface of the spin-orbit torque wiring 20, the first conductive layer 50 and the second pillar 40 may have the same main component among their constituent elements. The main component is an element that occupies 80% or more of the composition.

Next, a method of manufacturing the magnetoresistive effect element 100 will be described. The magnetoresistive effect element 100 is formed by a laminating process of each layer and a processing process of processing a part of each layer into a predetermined shape. The layers can be laminated by sputtering, chemical vapor deposition (CVD), electron beam deposition (EB deposition), atomic laser deposition, and the like. The layers can be processed by photolithography and the like.

First, the insulating layer 92 is formed on the insulating layer 91. Then, an opening is formed at a predetermined position of the insulating layer 92. Then, a conductive layer is formed and the opening is filled with a conductor. The conductor filled in the opening becomes the first conductive layer 50 and the second pillar 40. Then, the upper surfaces of the insulating layer 92, the first conductive layer 50, and the second pillar 40 are polished by chemical mechanical polishing (CMP).

Then, a layer that will become the spin-orbit torque wiring 20 and each layer that will become the laminate 10 are formed on one surface of the insulating layer 92, the first conductive layer 50, and the second pillar 40. First, each of the laminated layers is processed into a predetermined shape to obtain the spin-orbit torque wiring 20. After processing, each layer is covered with the insulating layer 93. Then, each layer that will become the laminate 10 and the insulating layer 93 are processed into a predetermined shape to obtain the laminate 10. Then, the laminate 10 is covered with the insulating layer 94.

Furthermore, the order of processing the spin-orbit torque wiring 20 and the laminate 10 may be reversed. For example, first, each layer that will become the laminate 10 may be processed into the shape of the laminate 10 and may be covered with the insulating layer 94. Then, the insulating layer 94 and the layer that will become the spin-orbit torque wiring 20 may be processed into the shape of the spin-orbit torque wiring 20 and may be covered with the insulating layer 93.

Then, an opening is formed at a position overlapping the first conductive layer 50 when viewed from the z direction in the insulating layer 94. The opening is formed until the opening reaches the first conductive layer 50 from the upper surface of the insulating layer 94. Then, the opening is filled with a conductor to thereby obtain the first pillar 30.

The magnetoresistive effect element 100 according to the first embodiment can ensure a sufficient electrical contact point between the first pillar 30 and the spin-orbit torque wiring 20.

When the first conductive layer 50 is not present, the first pillar 30 and the spin-orbit torque wiring 20 are in contact with each other at the side surface of the first pillar 30. Since the thickness of the spin-orbit torque wiring 20 is thin, in this case, it is difficult to ensure a sufficient contact point between the first pillar 30 and the spin-orbit torque wiring 20. When there are few contact points between the first pillar 30 and the spin-orbit torque wiring 20, a write current cannot be stably supplied to the spin-orbit torque wiring 20, and the reproducibility of the magnetization reversal of the first ferromagnetic layer 1 decreases. That is, the reliability of the magnetoresistive effect element 100 decreases.

In addition, since the magnetoresistive effect element 100 according to the first embodiment includes the first conductive layer 50, a write current can flow to the spin-orbit torque wiring 20 through the first conductive layer 50. By ensuring a sufficient current path for the write current reaching the spin-orbit torque wiring 20, the magnetization reversal of the first ferromagnetic layer 1 can be stabilized.

Second Embodiment

Figure 5:
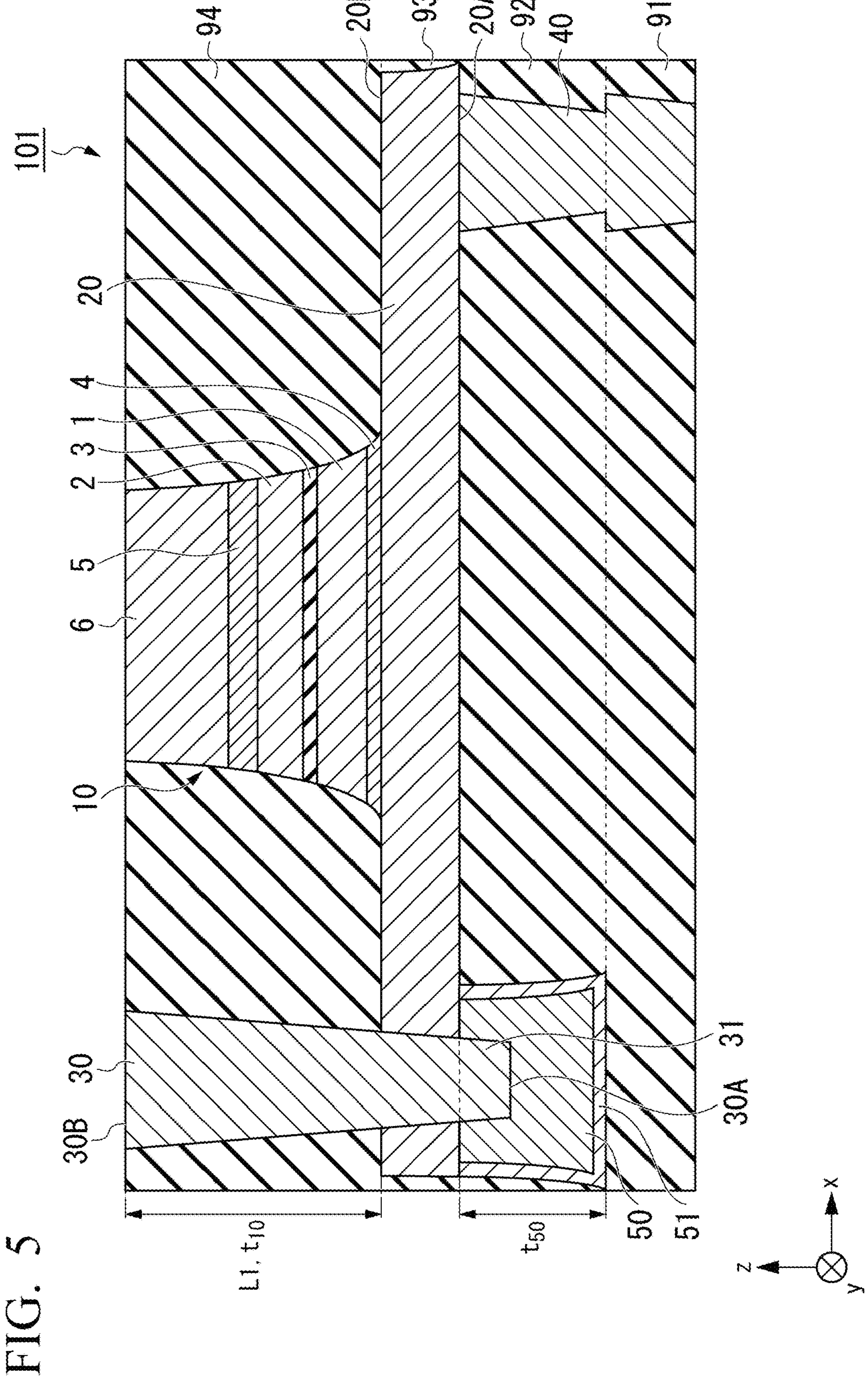
FIG. 5 is a cross-sectional view of a magnetoresistive effect element according to a second embodiment.

FIG. 5 is a cross-sectional view of a magnetoresistive effect element 101 according to a second embodiment. The magnetoresistive effect element 101 according to the second embodiment is different from the magnetoresistive effect element 100 according to the first embodiment in that a covering layer 51 is further provided. In the magnetoresistive effect element 101 according to the second embodiment, the same components as those in the magnetoresistive effect element 100 are denoted by the same reference numerals, and description thereof will be omitted.

The covering layer 51 covers the surfaces of the first conductive layer 50 other than the surface in contact with the first surface 20A of the spin-orbit torque wiring 20. The covering layer 51 is, for example, an oxide or a nitride. The covering layer 51 is preferably conductive.

For example, the covering layer 51 may have a lower etching rate than the first conductive layer 50 when subjected to ion milling under the same conditions. That is, the covering layer 51 may be less susceptible to etching than the first conductive layer 50 in ion milling under the same conditions. If the covering layer 51 is not easily etched by ion milling, the covering layer 51 functions as a stopper when forming the opening that will become the first pillar 30.

Furthermore, the covering layer 51 may have a lower etching rate than the first conductive layer 50 when subjected to reactive ion etching under the same conditions. That is, the covering layer 51 may be less susceptible to etching than the first conductive layer 50 in reactive ion etching under the same conditions. If the covering layer 51 is not easily etched by reactive ion etching, the covering layer 51 functions as a stopper when forming the opening that will become the first pillar 30.

The covering layer 51 is formed of, for example, Ti—N, Ta—N, Si—N, Si—O, MgO, Ta, Ru, or the like. Here, Si—O may be any compound of Si and O, and each composition ratio is not important. For example, $SiO_2$, $Si_3O_4$, and compounds that deviate from the stoichiometric composition are also included in Si—O. The same applies to Ti—N, Ta—N, and Si—N.

The magnetoresistive effect element 101 according to the second embodiment has the same effects as the magnetoresistive effect element 100 according to the first embodiment. Further, the magnetoresistive effect element 101 according to the second embodiment can stably form an opening as the first pillar 30.

Third Embodiment

Figure 6:
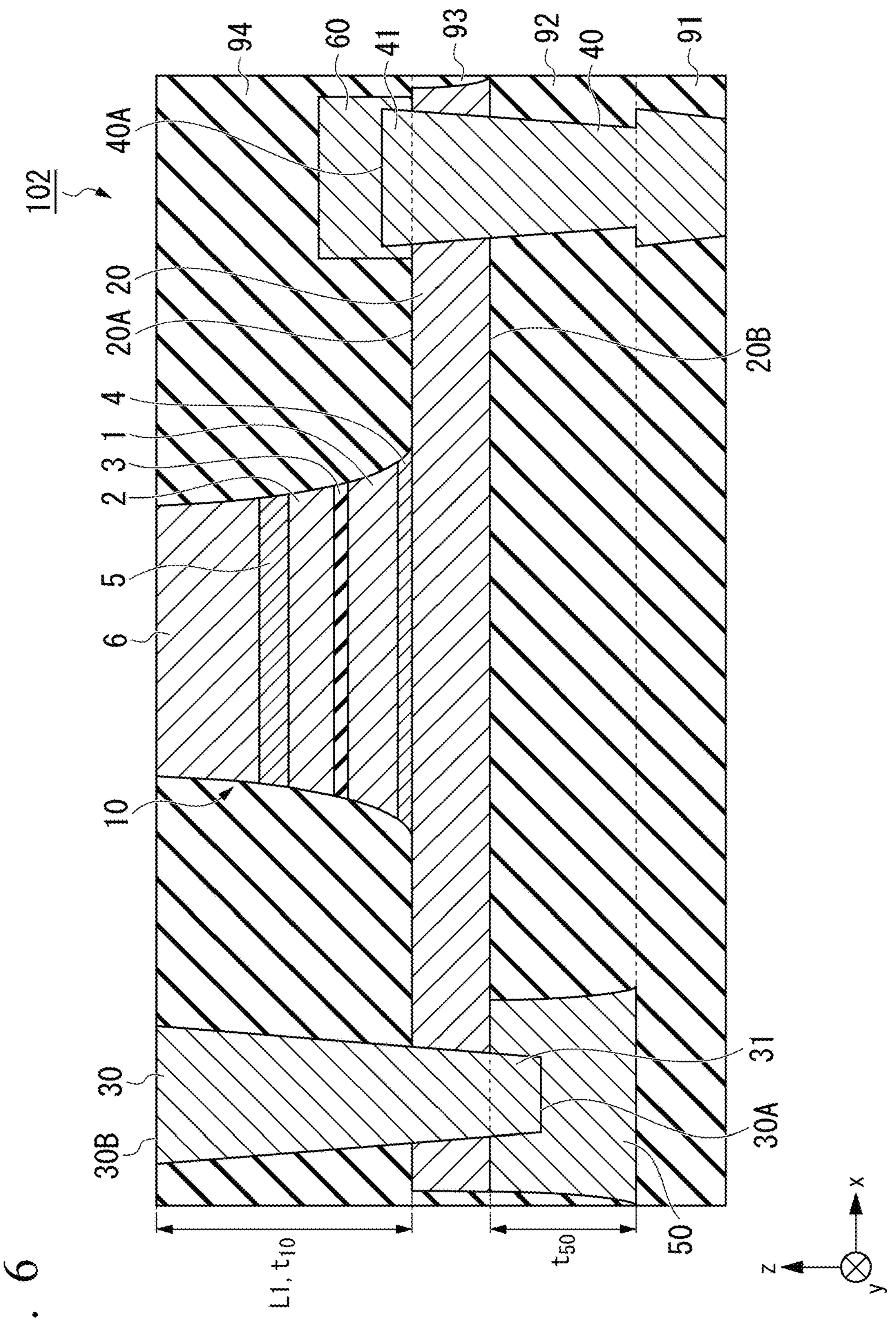
FIG. 6 is a cross-sectional view of a magnetoresistive effect element according to a third embodiment.
Figure 7:
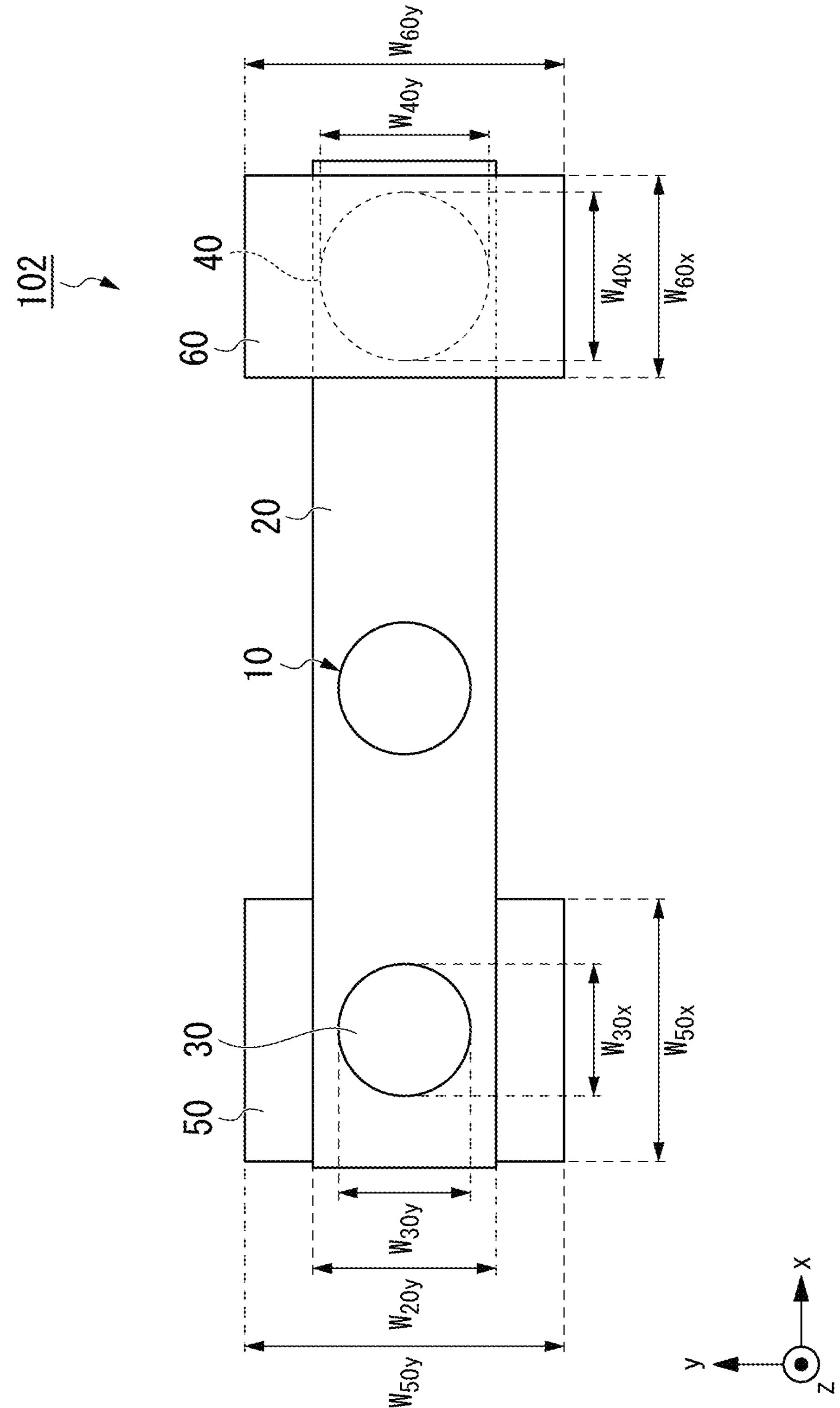
FIG. 7 is a plan view of the magnetoresistive effect element according to the third embodiment.

FIG. 6 is a cross-sectional view of a magnetoresistive effect element 102 according to a third embodiment. FIG. 7 is a plan view of the magnetoresistive effect element 102 according to the third embodiment. The magnetoresistive effect element 102 according to the third embodiment is different from the magnetoresistive effect element 100 according to the first embodiment in that a second conductive layer 60 is further provided. In the magnetoresistive effect element 102 according to the third embodiment, the same components as those in the magnetoresistive effect element 100 are denoted by the same reference numerals, and description thereof will be omitted.

The second pillar 40 penetrates the spin-orbit torque wiring 20. The second pillar 40 is in contact with the spin-orbit torque wiring 20 and the second conductive layer 60.

The second pillar 40 includes, for example, a first area 41. The first area 41 is a portion that protrudes from the spin-orbit torque wiring 20 in the second pillar 40 toward the second conductive layer 60.

The first area 41 is surrounded by the second conductive layer 60. In the first area 41, the side wall of the second pillar 40 is in contact with the second conductive layer 60 over the entire circumstance. Further, a first end 40A of the second pillar 40 is in contact with the second conductive layer 60. The first end 40A is an end close to the second conductive layer 60 in the z direction.

The second conductive layer 60 is in contact with the spin-orbit torque wiring 20. For example, the second conductive layer 60 is in contact with the spin-orbit torque wiring 20 at a position not overlapping the first ferromagnetic layer 1 when viewed from the z direction. For example, the second conductive layer 60 overlaps the second pillar 40 when viewed from the z direction.

The width $W_{60y}$ of the second conductive layer 60 in the y direction is wider than the width $W_{20y}$ of the spin-orbit torque wiring 20 in the y direction. The width $W_{60y}$ of the second conductive layer 60 in the y direction is wider than the width $W_{40y}$ of the second pillar 40 in the y direction. The width $W_{60x}$, of the second conductive layer 60 in the x direction is wider than the width $W_{40x}$ of the second pillar 40 in the x direction.

The second conductive layer 60 includes a conductive material. The second conductive layer 60 is formed of, for example, aluminum, copper, silver, or the like. The second conductive layer 60 may be formed of the same material as the spin-orbit torque wiring 20.

The magnetoresistive effect element 102 according to the third embodiment has the same effects as the magnetoresistive effect element 100 of the first embodiment. Further, the magnetoresistive effect element 102 according to the third embodiment can ensure a sufficient electrical contact point between the second pillar 40 and the spin-orbit torque wiring 20.

Fourth Embodiment

Figure 8:
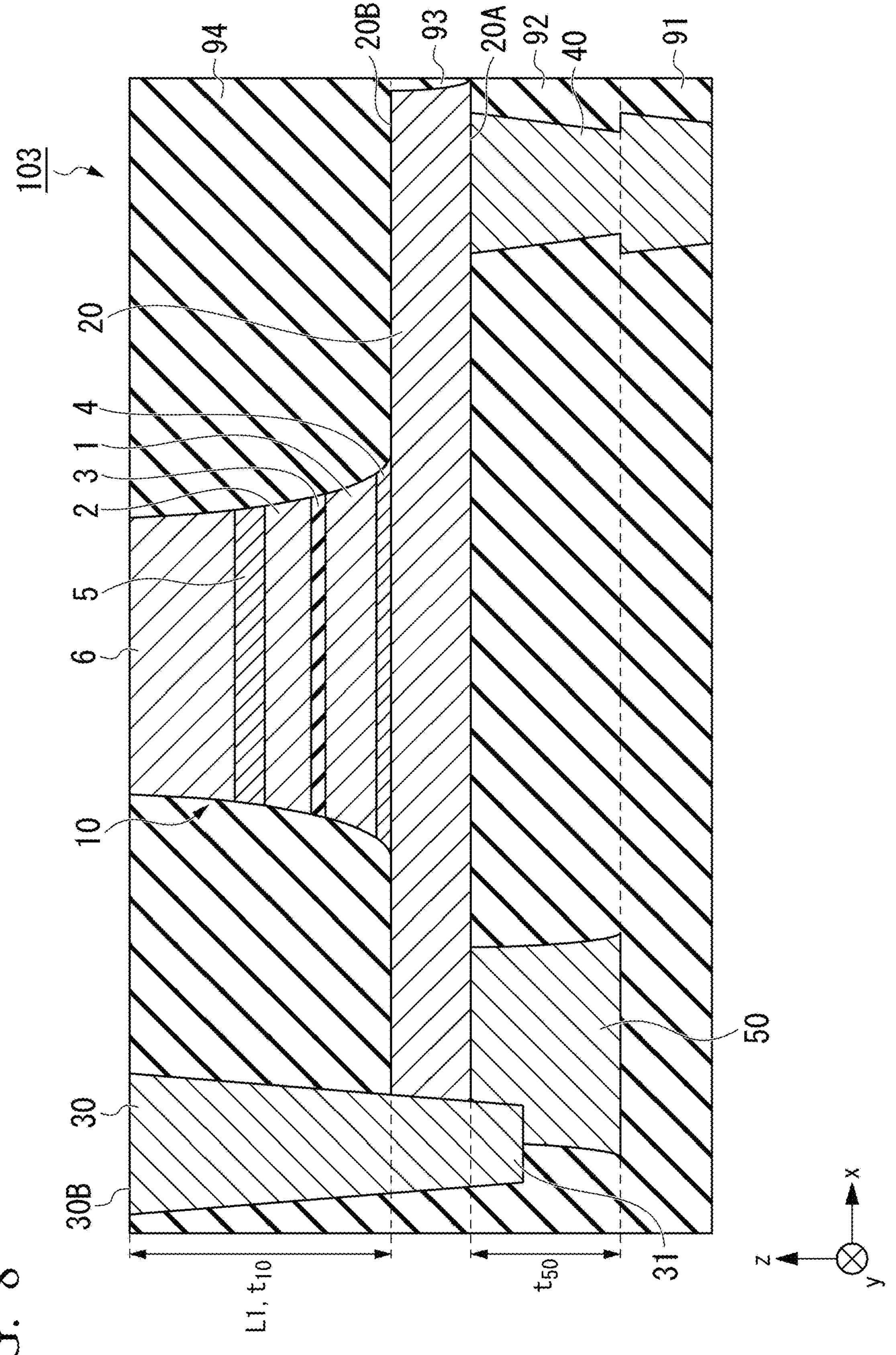
FIG. 8 is a cross-sectional view of a magnetoresistive effect element according to a fourth embodiment.
Figure 9:
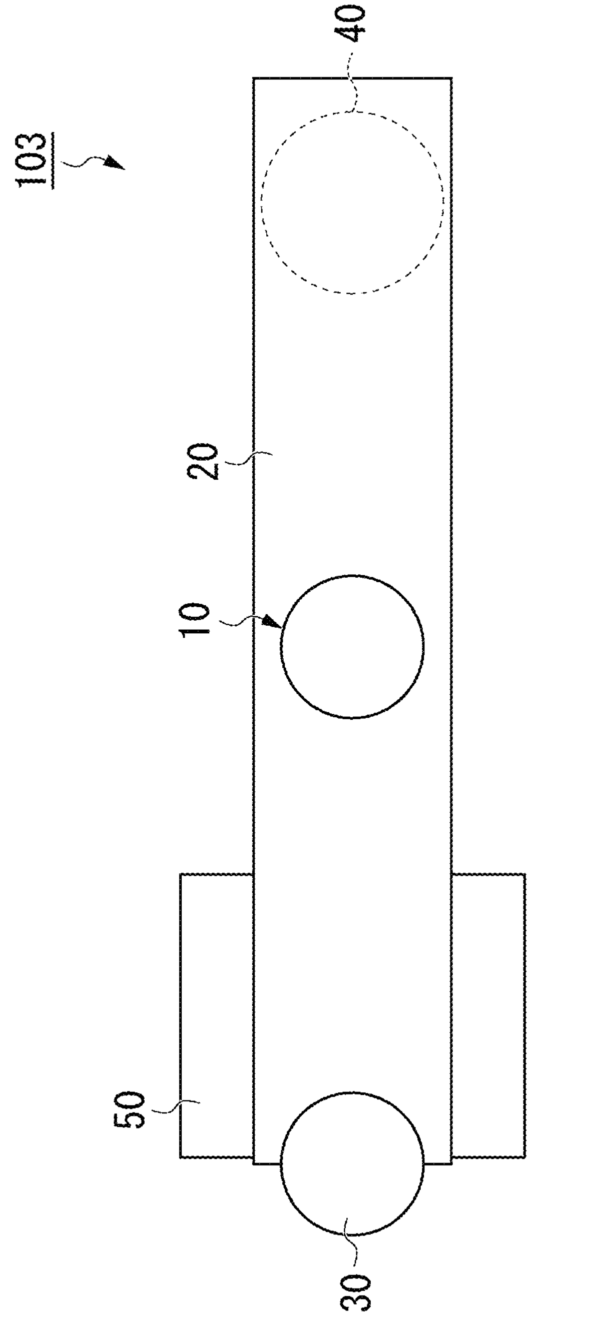
FIG. 9 is a plan view of the magnetoresistive effect element according to the fourth embodiment.
Figure 9:
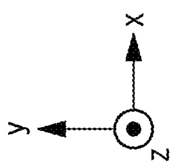

FIG. 8 is a cross-sectional view of a magnetoresistive effect element 103 according to a fourth embodiment. FIG. 9 is a plan view of the magnetoresistive effect element 103 according to the fourth embodiment. The magnetoresistive effect element 103 according to the fourth embodiment is different from the magnetoresistive effect element 100 according to the first embodiment in that the positional relationship of the first pillar 30 with respect to the spin-orbit torque wiring 20 and the first conductive layer 50 is different. In the magnetoresistive effect element 103 according to the fourth embodiment, the same components as those in the magnetoresistive effect element 100 are denoted by the same reference numerals, and description thereof will be omitted.

The first pillar 30 penetrates the spin-orbit torque wiring 20. The first pillar 30 is in contact with the spin-orbit torque wiring 20 and the first conductive layer 50.

A part of the first pillar 30 protrudes in the x direction from the end of the spin-orbit torque wiring 20 in the x direction when viewed from the z direction. In the first area 31 of the first pillar 30, a part of the side wall is in contact with the first conductive layer 50. Further, a part of the first end 30A of the first pillar 30 is in contact with the first conductive layer 50.

The magnetoresistive effect element 103 according to the fourth embodiment has the same effects as the magnetoresistive effect element 100 according to the first embodiment.

Fifth Embodiment

Figure 10:
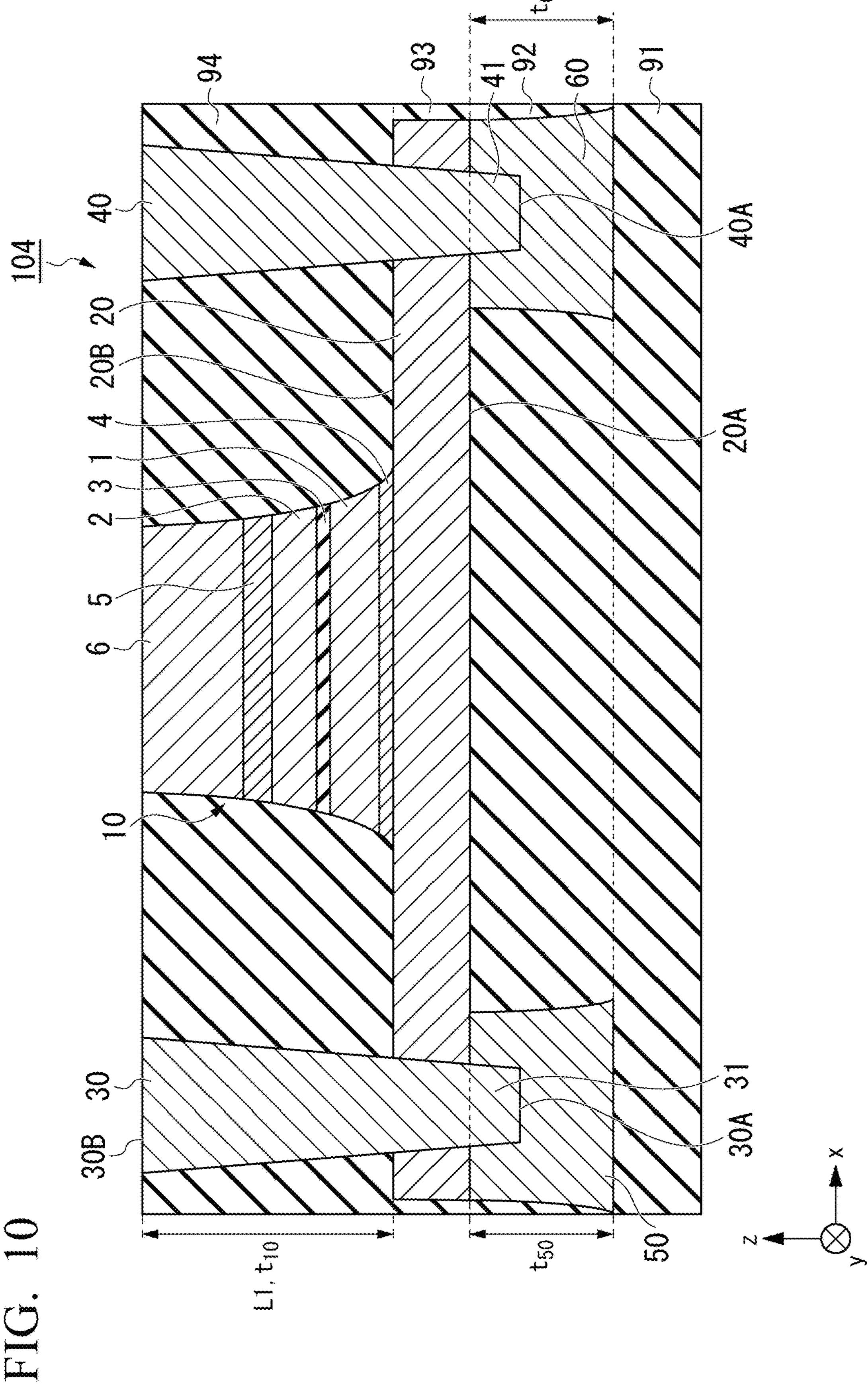
FIG. 10 is a cross-sectional view of a magnetoresistive effect element according to a fifth embodiment.

FIG. 10 is a cross-sectional view of a magnetoresistive effect element 104 according to a fifth embodiment. The magnetoresistive effect element 104 according to the fifth embodiment is different from the magnetoresistive effect element 102 according to the third embodiment in that the extension direction of the second pillar 40 is different. In the magnetoresistive effect element 104 according to the fifth embodiment, the same components as those in the magnetoresistive effect element 102 are denoted by the same reference numerals, and description thereof will be omitted.

The second pillar 40 penetrates the spin-orbit torque wiring 20. The second pillar 40 is in contact with the spin-orbit torque wiring 20 and the second conductive layer 60. The second pillar 40 extends in the same direction as the first pillar 30 with respect to the plane in which the spin-orbit torque wiring 20 extends. The midpoint of the second pillar 40 in the z direction and the midpoint of the first pillar 30 in the z direction are both on the same side with respect to the plane in which the spin-orbit torque wiring 20 extends.

The second conductive layer 60 is in contact with the first surface 20A which is the same contact surface as the first conductive layer 50 in the spin-orbit torque wiring 20.

The height of the second pillar 40 is substantially equal to, for example, the height of the first pillar 30. The film thickness $t_{60}$ of the second conductive layer 60 is substantially equal to the film thickness $t_{50}$ of the first conductive layer 50.

The magnetoresistive effect element 104 according to the fifth embodiment has the same effects as the magnetoresistive effect element 100 according to the first embodiment.

Sixth Embodiment

Figure 11:
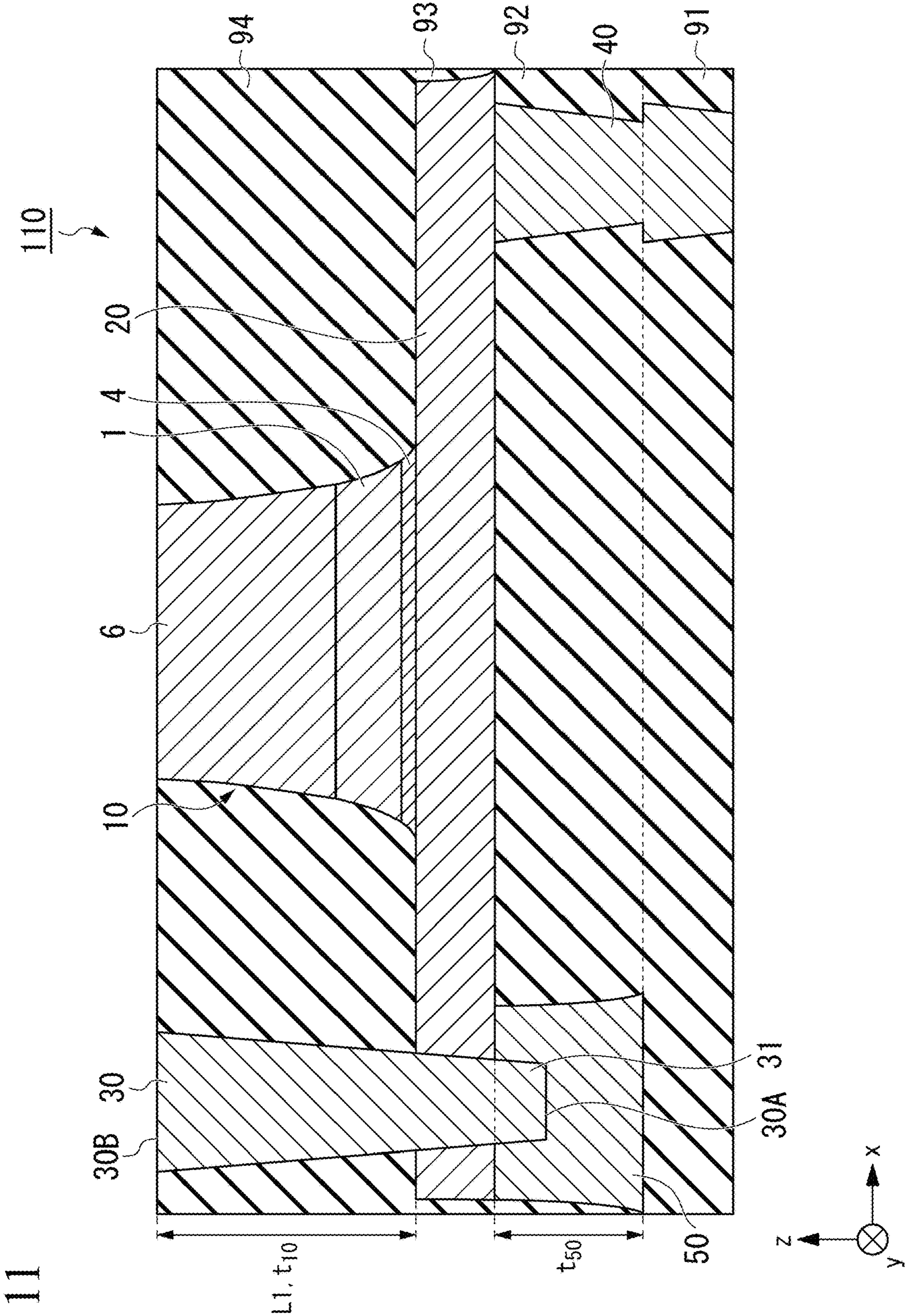
FIG. 11 is a cross-sectional view of a magnetization rotation element according to a sixth embodiment.

FIG. 11 is a cross-sectional view of a magnetization rotation element 110 according to a sixth embodiment. In FIG. 11, the magnetization rotation element 110 is replaced with the magnetoresistive effect element 100 according to the first embodiment. The magnetization rotation element 110 is different from the magnetoresistive effect element 100 in that the second ferromagnetic layer 2 and the non-magnetic layer 3 are not provided.

For example, the magnetization rotation element 110 causes light to be incident on the first ferromagnetic layer 1 and evaluates the light reflected by the first ferromagnetic layer 1. When the orientation of magnetization changes due to the magnetic Kerr effect, the polarization state of the reflected light changes. The magnetization rotation element 110 can be used as an optical element, for example, in an image display device or the like, which uses differences in the polarization state of light.

In addition, the magnetization rotation element 110 can be used alone as an anisotropic magnetic sensor, an optical element using the magnetic Faraday effect, or the like.

The magnetization rotation element 110 according to the sixth embodiment is the same as the magnetoresistive effect element 100 except that the non-magnetic layer 3 and the second ferromagnetic layer 2 are removed, and the same effect as the magnetoresistive effect element 100 according to the first embodiment can be obtained.

Although the preferred aspects of the present invention have been illustrated by way of some embodiments, the present invention is not limited to these embodiments. For example, the characteristic configurations of each embodiment may be applied to other embodiments and modified examples.

REFERENCE SIGNS LIST

1 First ferromagnetic layer
2 Second ferromagnetic layer
3 Non-magnetic layer
4 Underlayer
5 Cap layer
6 Mask layer
10 Laminate
20 Spin-orbit torque wiring
20A First surface
20B Second surface
30 First pillar
30A, 40A First end
30B, 40B Second end
31, 41 First area
40 Second pillar
50 First conductive layer
51 Covering layer
60 Second conductive layer
90, 91, 92, 93, 94 Insulating layer
100, 101, 102, 103, 104 Magnetoresistive effect element
110 Magnetization rotation element
200 Magnetic memory

The invention claimed is:

1. A magnetization rotation element comprising:
a spin-orbit torque wiring;
a first ferromagnetic layer;
a first pillar;
a second pillar; and
a first conductive layer,
wherein the first ferromagnetic layer faces at least a part of the spin-orbit torque wiring,
wherein the first conductive layer is in contact with the spin-orbit torque wiring at a position not overlapping the first ferromagnetic layer when viewed from a laminating direction,
wherein the first pillar penetrates the spin-orbit torque wiring and is in contact with the spin-orbit torque wiring and the first conductive layer, and
wherein the second pillar is in contact with the spin-orbit torque wiring at a position sandwiching the first ferromagnetic layer together with the first pillar when viewed from the laminating direction.

2. The magnetization rotation element according to claim 1,
wherein a part of a side wall of the first pillar is in contact with the first conductive layer over the entire circumstance.

3. The magnetization rotation element according to claim 1,
wherein a first end of the first pillar in the laminating direction is in contact with the first conductive layer.

4. The magnetization rotation element according to claim 1, further comprising:

a covering layer, wherein the covering layer covers a surface other than a surface in contact with the spin-orbit torque wiring of the first conductive layer.

5. The magnetization rotation element according to claim 4, wherein the covering layer has an etching rate lower than that of the first conductive layer when ion milling is performed under the same conditions.

6. The magnetization rotation element according to claim 4, wherein the covering layer has an etching rate lower than that of the first conductive layer in reactive ion etching under the same conditions.

7. The magnetization rotation element according to claim 1, wherein the first conductive layer has a film thickness of 5% or more of a height of a perpendicular line extending from a second end of the first pillar to the spin-orbit torque wiring, and wherein the second end is an end of the first pillar farther from the first conductive layer in the laminating direction.

8. The magnetization rotation element according to claim 1, wherein the first conductive layer has a film thickness of 300% or less of a height of a perpendicular line extending from a second end of the first pillar to the spin-orbit torque wiring, and wherein the second end is an end of the first pillar farther from the first conductive layer in the laminating direction.

9. The magnetization rotation element according to claim 1, wherein the first conductive layer and the second pillar are in contact with the same surface of the spin-orbit torque wiring, and wherein the first conductive layer and the second pillar have the same main component among their constituent elements.

10. The magnetization rotation element according to claim 1, further comprising:

a second conductive layer, wherein the second conductive layer is in contact with the spin-orbit torque wiring, and wherein the second pillar penetrates the spin-orbit torque wiring and is in contact with the spin-orbit torque wiring and the second conductive layer.

11. A magnetoresistive effect element comprising:

at least the magnetization rotation element according to claim 1, a non-magnetic layer, and a second ferromagnetic layer, wherein the first ferromagnetic layer of the magnetization rotation element and the second ferromagnetic layer sandwich the non-magnetic layer.

12. A magnetic memory comprising:

the magnetoresistive effect element according to claim 11.

* * * * *